(12) United States Patent
Han et al.

(10) Patent No.: US 8,633,098 B2
(45) Date of Patent: Jan. 21, 2014

(54) METHOD OF MANUFACTURING A SEMICONDUCTOR DEVICE

(75) Inventors: Kai Han, Beijing (CN); Wenwu Wang, Beijing (CN); Xiaolei Wang, Beijing (CN); Shijie Chen, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 201 days.

(21) Appl. No.: 13/061,774

(22) PCT Filed: Sep. 28, 2010

(86) PCT No.: PCT/CN2010/077384
§ 371 (c)(1),
(2), (4) Date: Mar. 2, 2011

(87) PCT Pub. No.: WO2011/127720
PCT Pub. Date: Oct. 20, 2011

(65) Prior Publication Data
US 2012/0021596 A1    Jan. 26, 2012

(30) Foreign Application Priority Data
Apr. 14, 2010 (CN) .......................... 2010 1 0147605

(51) Int. Cl.
*H01L 21/28* (2006.01)

(52) U.S. Cl.
USPC ....... 438/591; 438/287; 438/652; 257/E21.19

(58) Field of Classification Search
USPC .......................... 438/287, 591, 652
See application file for complete search history.

(56) References Cited

U.S. PATENT DOCUMENTS 6,797,572 B1 * 9/2004 Jeon et al. ..................... 438/287
2011/0241130 A1 * 10/2011 Chan et al. .................... 257/410

* cited by examiner

*Primary Examiner* — Alexander Ghyka
(74) *Attorney, Agent, or Firm* — Troutman Sanders LLP

(57) ABSTRACT

The present invention relates to the field of semiconductor manufacturing. The present invention provides a method of manufacturing a semiconductor device, which comprises: providing a semiconductor substrate; forming an interface layer, a gate dielectric layer and a gate electrode on the substrate; forming a metal oxygen absorption layer on the gate electrode; performing a thermal annealing process on the semiconductor device so that the metal oxygen absorption layer absorbs oxygen in the interface layer and the thickness of the interface layer is reduced. By means of the present invention, the thickness of the interface layer can be reduced on one hand, and on the other hand the metal in the metal oxygen absorption layer is made to diffuse into the gate electrode and/or the gate dielectric layer through the annealing process, which further achieves the effects of adjusting the effective work function and controlling the threshold voltage.

6 Claims, 3 Drawing Sheets

METHOD OF MANUFACTURING A SEMICONDUCTOR DEVICE

BENEFIT CLAIMS

This application is a US National Stage of International Application No. PCT/CN2010/077384, filed Sep. 28, 2010, which claims the benefit of CN 201010147605.5, filed Apr. 14, 2010.

FIELD OF THE INVENTION

The present invention generally relates to a method of manufacturing a semiconductor device, particularly to a method of manufacturing a high-k/metal gate semiconductor device that removes the oxygen atoms from the interface layer.

DESCRIPTION OF THE PRIOR ART

During decades of development of microelectronic technique, manufacturers of logic chips have always been employing $SiO_2$ as the gate dielectric and employing heavily doped polysilicon as the material for gate electrodes when manufacturing MOS devices. However, with the ever-decreasing feature size, the gate dielectric of $SiO_2$ in the MOS transistor has approximated to its limit. For example, in 65 nm process, the thickness of the $SiO_2$ gate dielectric has been reduced to 1.2 nm, which is about the thickness of 5 silicon atom layers. If this thickness continues to reduce, the leakage current and the power consumption will increase dramatically, and problems like diffusion of doped boron atoms, polysilicon depletion effect, and extraordinarily high gate resistance caused by the polysilicon gate electrode, will become more and more serious. For technology generations of 32 nm and smaller, new materials, new processes and new device structures are desired to solve the problems of the dramatically increasing leakage current and power consumption, etc.

In order to reduce the leakage current and power consumption, there is an improved technique that uses the "high-k/metal gate" structure. At present, major semiconductor companies all over the world have set out to develop the "high-k/metal gate" technique oriented to the technology generations of 32 nm and smaller. Intel has disclosed that after using the high-k gate dielectric material, the leakage current of the device is reduced to 1/10th of the original one. Nevertheless, in the high-k metal gate process, the annealing process that must be adopted causes the interface layer to become thicker during the annealing process. However, the CMOS device with feature size smaller than 45 nm has very serious short channel effect and a gate dielectric with an EOT (Equivalent Oxide Thickness) of not more than 1 nm is needed to better control of the channel, therefore a thick interface layer $SiO_2$ would be unacceptable. Especially in 32 nm and 22 nm process technology, the EOT of the gate dielectric needs to be less than 0.7 nm or even 0.5 nm, while in the common high-k/metal gate technology, the thickness of the interface layer $SiO_2$ itself is 0.5-0.7 nm.

Hence, there is a need to provide a method of manufacturing a semiconductor device that can effectively reduce the EOT, especially the interface layer thickness.

SUMMARY OF THE INVENTION

The present invention provides a method of manufacturing a semiconductor device, which comprises: providing a semiconductor substrate; forming an interface layer, a gate dielectric layer and a gate electrode on the substrate; forming a metal oxygen absorption layer on the gate electrode; performing a thermal annealing process on the semiconductor device so that the metal oxygen absorption layer absorbs oxygen in the interface layer and the thickness of the interface layer is reduced. The metal oxygen absorption layer is formed from one or more elements selected from a group consisting of Al, Be, La and Y. The thickness of the metal oxygen absorption layer is about 1-5 nm.

In the method of the present invention, the metal oxygen absorption layer for absorbing oxygen in the interface layer is formed on the gate electrode, which prevents the oxygen in the outer atmosphere from entering into the interface layer during the annealing process and prevents increase in the thickness of the $SiO_2$ interface layer. With the oxygen absorption technique, the thickness of the $SiO_2$ interface layer that otherwise would be 0.5-1 nm is reduced to be smaller than 0.5 nm or even zero during the annealing process, thereby effectively reducing the EOT of the device.

DETAILED DESCRIPTION OF THE INVENTION

Figure 1:
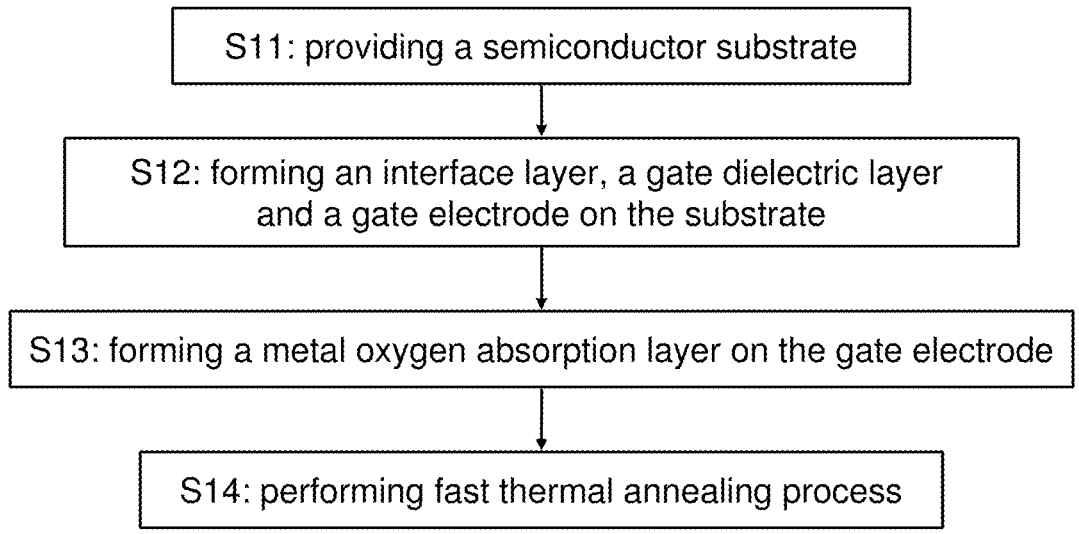
FIG. 1 shows a flow chart of a manufacturing method of a semiconductor device according to a first embodiment of the present invention.

The present invention generally relates to a method of manufacturing a semiconductor device. The following disclosure provides many different embodiments or examples for realizing different structures of the present invention. To simplify the disclosure of the present invention, the components and configuration of specific examples are described in the following text. Of course, they are merely examples and are not intended to limit the invention. In addition, reference numerals and/or letters can be repeated in different examples in the present invention, and such repetition is for the purpose of concision and clarity, which in itself does not discuss the relationship between the various embodiments and/or configurations. Furthermore, the present invention provides examples of various specific techniques and materials, but those skilled in the art will be aware of the applicability of other techniques and/or materials. Moreover, the structure in which the first element is "above" the second element as described below may include the embodiment where the first and second elements are formed to be in direct contact, or it may also include the embodiment where a further element is formed between the first and second elements, in which case the first and second elements may not be in direct contact.

Figure 2:
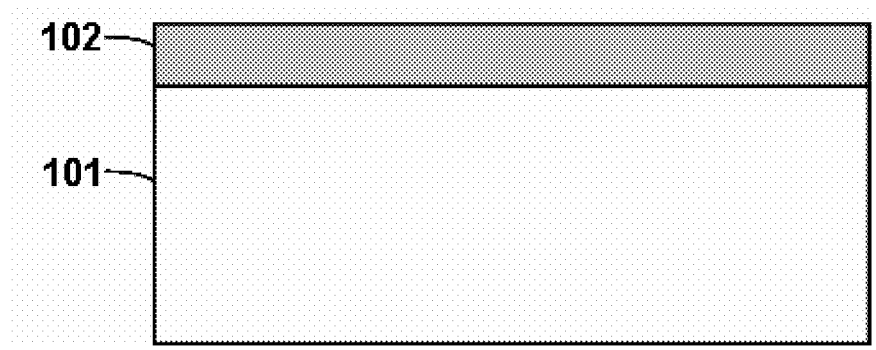
FIGS. 2-5 are schematic drawings of the respective manufacturing stages of the semiconductor device according to the first embodiment of the present invention.

According to the first embodiment of the present invention, reference is made to FIG. 1. FIG. 1 shows a flow chart of a manufacturing method of a semiconductor device according to the present invention. In step S11, a semiconductor substrate is provided, as shown in FIG. 2. In this embodiment, the substrate 101 comprises a silicon substrate (e.g. a wafer) in a crystal structure. The substrate 101 may also comprise other basic semiconductors or compound semiconductors, such as Si, Ge, GeSi, GaAs, InP, SiC, diamond or the like. According to the design requirements (e.g. p-type substrate or n-type substrate) known in the prior art, the substrate 101 may comprise various doped configurations. In addition, the substrate 101 may optionally comprises an epitaxial layer which can be changed by stress to enhance its performance, and may optionally comprise a Silicon-On-Insulator (SOI) structure.

Figure 3:
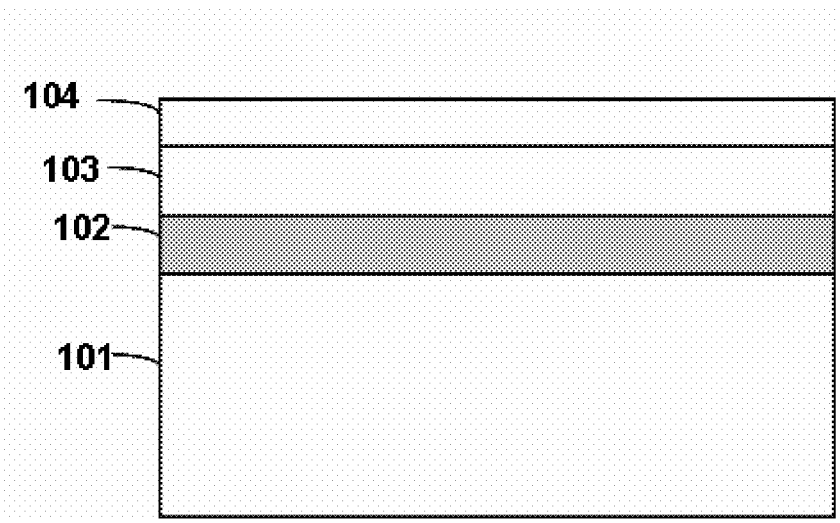

In step S12, an interface layer 102, a gate dielectric layer 103 and a gate electrode 104 are formed on the substrate 101, as shown in FIG. 2. The interface layer 102 may be formed on the substrate 101 by thermal growth. In an embodiment of the present invention, the interface layer 102 is $SiO_2$ or an oxynitride layer, which has a thickness of about 0.7 nm. Thereafter, as shown in FIG. 3, the gate dielectric layer 103 and the gate electrode 104 are formed on the interface layer 102. Preferably, the gate dielectric layer 103 is a high-k gate dielectric layer 103. Specifically, first, the high-k gate dielectric layer 103, such as a layer of a high-k dielectric material of $HfO_2$, $HfSiO_x$, $HfZrO_x$, $HfLaO_x$, $HfLaON_x$, and $La_2O_3$, is grown on the interface layer 102 using ALD technique and has a thickness of about 0.5 nm-3 nm. Afterwards, the gate electrode 104 is deposited on the high-k gate dielectric layer 103. The gate electrode can be a multi-layered structure, which may include metal, metal compound, metal silicide, and any combination thereof. In an embodiment of the present invention, the gate electrode is a metal gate 104 with a thickness of about 5 nm to 50 nm, which may include HfN, TiN, TaN, MoN, TiAlN, MoAlN, $HfCN_x$, HfC, TiC, TaC, Ru, Re, Pt, $RuO_2$, $TaRu_x$, HfRu, and any combination thereof.

Figure 4:
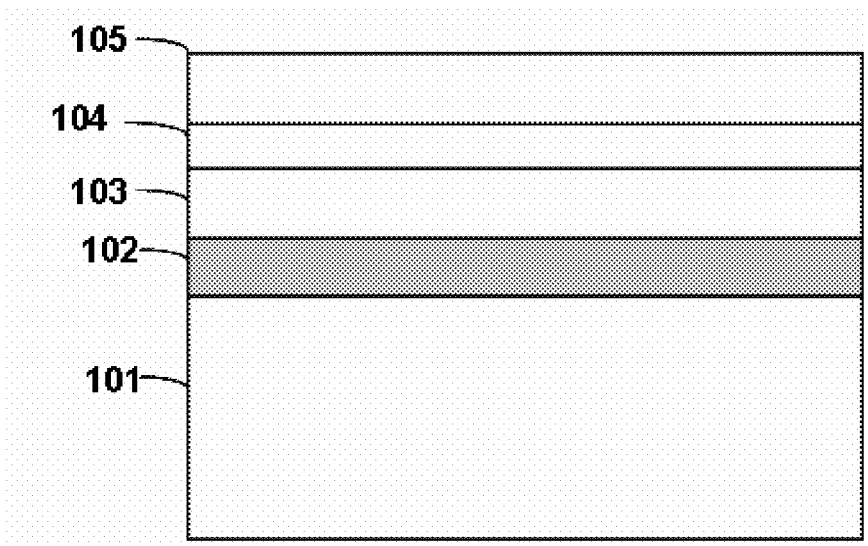

Then in step S13, a metal oxygen absorption layer 105 is formed on the gate electrode 104. As shown in FIG. 4, the metal oxygen absorption layer 105 can be formed by such method as deposition, co-sputtering or the like, and has a thickness of about 1-5 nm, preferably 2 nm. The metal oxygen absorption layer may include Al, Be, La and Y.

Figure 5:
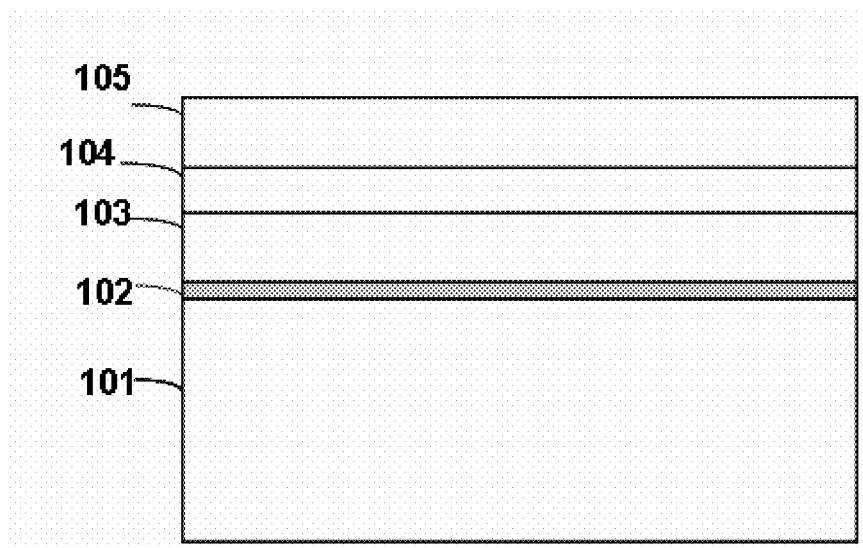

In step S14, a thermal annealing process is performed on the device structure, so that the metal oxygen absorption layer 105 absorbs oxygen from the interface layer 102 to reduce the thickness of the interface layer 102. The temperature and time of the annealing process can be controlled. For example, the annealing temperature can be lowered and the annealing time can be prolonged, so that the metal in the metal oxygen absorption layer diffuses into the entire gate electrode 104, even into the gate dielectric layer 103 to adjust the effective work function, thereby achieving the effect of adjusting the threshold voltage of the NMOS device and PMOS device. In addition, the annealing process will oxidize the oxygen absorption layer 105 into a metal oxide and reduce the thickness of the interface layer 102, as shown in FIG. 5. In this embodiment, the temperature of thermal processing is about 300-1000° C., preferably 400° C., and the time of thermal processing is about 1-300 s, preferably 60 s.

Then, subsequent manufacturing processes are performed on the device, including patterning the metal oxygen absorption layer 105, the gate electrode 104, the gate dielectric layer 103 and the interface layer 102 to form a gate stack, forming side wall spacers on the side walls of the gate stack, and forming a source region and a drain region which could be carried out after the optional process of forming a source/drain shallow junction region, thereby forming the final semiconductor device structure.

The above describes the method of reducing the thickness of the interface layer 102 by means of the oxygen absorption layer 105. According to an embodiment of the present invention, the metal oxygen absorption layer 105 is formed on the gate electrode 104, which is formed of such metal as Al, Be, La or Y, etc., and then a thermal annealing is performed, during which the time and temperature of annealing are appropriately chosen. The annealing time and temperature are chosen according to the thickness of both the oxygen absorption layer and the gate dielectric layer. In an embodiment of the present invention, the annealing temperature is chosen to be 600° C. and the annealing time is chosen to be 20 s.

Furthermore, annealing can be performed once or several times as required. Finally, the metal in the metal oxygen absorption layer is diffused into the entire gate electrode 104, even into the gate dielectric layer 103, so as to adjust the effective work function, thereby achieving the effect of adjusting the threshold voltage of the NMOS device and PMOS device. For example, diffusion of metal Al, La and Y into the entire metal gate and/or high-k gate dielectric layer can adjust the effective work function of the NMOS device, while diffusion of metal Al and Be into the metal gate and/or high-k gate dielectric layer can adjust the effective work function of the PMOS device. Meanwhile, the Gibbs free energy change produced by the selected metals is much larger than that produced by Si, so the oxides of such metals are more stable and can be more easily formed than the silicon oxide in the interface layer 102. Consequently, during the high temperature process, the oxygen in the $SiO_2$ interface layer is driven to form metal oxides with the oxygen absorption layer 105, which results in reduction or even disappearance of the thickness of the interface layer 102, thereby effectively reducing the EOT. In addition, after the oxygen absorption layer 105 is oxidized into a metal oxide 112 under appropriately controlled annealing temperature and time, the metal oxide 112 might be an unsaturated metal oxide, which can prevent the oxygen in the outer atmosphere from entering into the interface layer 102 during annealing in the subsequent process and avoid or reduce the possibility of increase in the thickness of the interface layer 102, thereby avoiding the increase of the EOT while reducing the EOT.

Although the example embodiments and the advantages thereof have been described in detail, it shall be understood that various changes, substitutions and modifications can be made to said embodiments without departing from the spirit of the invention and the protection scope defined by the appended claims. As for other examples, those ordinarily skilled in the art shall easily understand that the sequence of the process steps may be changed without departing from the protection scope of the present invention.

In addition, the application of the present invention is not limited to the techniques, mechanisms, fabrication, compositions, means, methods and steps in the specific embodiments described in the description. On the basis of the disclosure of the present invention, those ordinarily skilled in the art shall easily understand that the existing or to be developed techniques, mechanisms, fabrication, compositions, means, methods and steps, which have substantially the same function or achieve substantially the same effect as the respective embodiments described in the present invention, can also be used according to the present invention. Therefore, the appended claims intend to include such techniques, mechanisms, fabrication, compositions, means, methods and steps in the protection scope thereof.

What is claimed is:

1. A method of manufacturing a semiconductor device, comprising:
   providing a semiconductor substrate;
   forming an interface layer, a gate dielectric layer and a gate electrode on the substrate;
   forming a metal oxygen absorption layer on the gate electrode;
   performing a thermal annealing process on the semiconductor device so that the metal oxygen absorption layer absorbs oxygen in the interface layer and the thickness of the interface layer is reduced, wherein the temperature of the thermal annealing process is 600° C. and the annealing time is 20 s.

2. The method according to claim 1, wherein the metal oxygen absorption layer is formed from one or more elements selected from the group consisting of Al, Be, La and Y.

3. The method according to claim 1, wherein the thickness of the metal oxygen absorption layer is 1-5 nm.

4. The method according to claim 1, wherein the gate dielectric layer is formed from one or more species selected from the group consisting of HfO2, HfSiOx, HfZrOx, HfLaOx, HfLaONx and La2O3.

5. The method according to claim 1, wherein the gate electrode is formed from one or more species selected from the group consisting of HfN, TiN, TaN, MoN, TiAlN, MoAlN, HfCNx, HfC, TiC, TaC, Ru, Re, Pt, RuO2, TaRux and HfRu.

6. The method according to claim 1, wherein the metal oxygen absorption layer is formed by deposition or co-sputtering.

* * * * *